(12) United States Patent
Lin et al.

(10) Patent No.: US 8,450,854 B2
(45) Date of Patent: May 28, 2013

(54) INTERCONNECT STRUCTURES WITH PATTERNABLE LOW-K DIELECTRICS AND METHOD OF FABRICATING SAME

(75) Inventors: Qinghuang Lin, Yorktown Heights, NY (US); Shyng-Tsong Chen, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 12/841,359

(22) Filed: Jul. 22, 2010

(65) Prior Publication Data
US 2010/0283157 A1 Nov. 11, 2010

Related U.S. Application Data

(62) Division of application No. 11/858,624, filed on Sep. 20, 2007, now Pat. No. 8,084,862.

(51) Int. Cl.
*H01L 23/522* (2006.01)
*H01L 21/768* (2006.01)

(52) U.S. Cl.
USPC ............ 257/773; 257/E21.575; 257/E21.576; 257/E21.577; 257/E21.579; 438/72; 438/622; 438/636; 438/637; 430/269; 430/270.1; 430/280.1; 428/446; 428/450

(58) Field of Classification Search
USPC ...... 257/488, 117, E21.59, E23.142; 438/618
See application file for complete search history.

(56) References Cited

U.S. PATENT DOCUMENTS

| | | | |
|---|---|---|---|
| 4,371,605 A | 2/1983 | Renner | |
| 4,956,313 A | 9/1990 | Cote et al. | |
| 5,570,213 A | 10/1996 | Ruiz et al. | |
| 5,886,102 A | 3/1999 | Sinta et al. | |
| 5,939,236 A | 8/1999 | Pavelchek et al. | |
| 6,087,064 A | 7/2000 | Lin et al. | |

(Continued)

FOREIGN PATENT DOCUMENTS

| | | |
|---|---|---|
| CA | 1204547 | 5/1986 |
| JP | 1293339 | 11/1989 |

(Continued)

OTHER PUBLICATIONS

Office Action dated Sep. 24, 2010, received in the parent U.S. Patent Application, namely U.S. Appl. No. 11/858,624.

(Continued)

*Primary Examiner* — Matthew W Such
*Assistant Examiner* — William Harriston
(74) *Attorney, Agent, or Firm* — Scully, Scott, Murphy & Presser, P.C.; Louis J. Percello, Esq.

(57) ABSTRACT

The present invention provides an interconnect structure in which a patternable low-k material is employed as an interconnect dielectric material. Specifically, this invention relates to single-damascene and dual-damascene low-k interconnect structures with at least one patternable low-k dielectric. In general terms, the interconnect structure includes at least one patterned and cured low-k dielectric material located on a surface of a substrate. The at least one cured and patterned low-k material has conductively filled regions embedded therein and typically, but not always, includes Si atoms bonded to cyclic rings via oxygen atoms. The present invention also provides a method of forming such interconnect structures in which no separate photoresist is employed in patterning the patterned low-k material.

17 Claims, 4 Drawing Sheets

U.S. PATENT DOCUMENTS

| | | | |
|---|---|---|---|
| 6,093,508 A | 7/2000 | Cote | |
| 6,235,877 B1 | 5/2001 | Scolastico et al. | |
| 6,274,292 B1 | 8/2001 | Holscher et al. | |
| 6,274,515 B1 | 8/2001 | Hughes et al. | |
| 6,323,123 B1 | 11/2001 | Liu et al. | |
| 6,514,667 B2 | 2/2003 | Angelopoulos et al. | |
| 6,518,668 B2 | 2/2003 | Cohen | |
| 6,531,474 B1 | 3/2003 | Wannamaker et al. | |
| 6,555,283 B1 | 4/2003 | Zhong et al. | |
| 6,586,842 B1 | 7/2003 | You et al. | |
| 6,610,151 B1 | 8/2003 | Cohen | |
| 6,624,053 B2 | 9/2003 | Passemard | |
| 6,628,358 B1 | 9/2003 | Colson | |
| 6,649,531 B2 | 11/2003 | Cote et al. | |
| 6,677,679 B1 | 1/2004 | You et al. | |
| 6,713,234 B2 | 3/2004 | Sandhu et al. | |
| 6,713,874 B1 | 3/2004 | Hopper et al. | |
| 6,730,593 B2 | 5/2004 | Yau et al. | |
| 6,737,345 B1 | 5/2004 | Lin et al. | |
| 6,803,249 B2 | 10/2004 | Thomas et al. | |
| 6,806,203 B2 | 10/2004 | Weidman et al. | |
| 6,815,333 B2 | 11/2004 | Townsend, III et al. | |
| 6,846,741 B2 | 1/2005 | Cooney, III et al. | |
| 6,873,026 B1 | 3/2005 | Brunemeier et al. | |
| 6,888,251 B2 | 5/2005 | Cooney, III et al. | |
| 6,903,016 B2 | 6/2005 | Cohen | |
| 6,916,696 B1 | 7/2005 | Buynoski | |
| 6,924,226 B2 | 8/2005 | Cohen | |
| 6,939,793 B1 | 9/2005 | You et al. | |
| 6,939,796 B2 | 9/2005 | Lohokare et al. | |
| 6,969,753 B2 | 11/2005 | Baldwin et al. | |
| 7,001,847 B2 | 2/2006 | Watatani | |
| 7,030,031 B2 | 4/2006 | Wille et al. | |
| 7,041,748 B2 | 5/2006 | Lin et al. | |
| 7,056,840 B2 | 6/2006 | Miller et al. | |
| 7,067,894 B2 | 6/2006 | Sandhu et al. | |
| 7,544,623 B2 | 6/2009 | Chou et al. | |
| 7,666,794 B2 | 2/2010 | Lin | |
| 2001/0054766 A1 | 12/2001 | Dirahoui et al. | |
| 2002/0012876 A1 | 1/2002 | Angelopoulos et al. | |
| 2002/0024139 A1 | 2/2002 | Chan et al. | |
| 2002/0092763 A1 | 7/2002 | Denning et al. | |
| 2002/0155695 A1 | 10/2002 | Lee et al. | |
| 2002/0173079 A1 | 11/2002 | Kaltalioglu | |
| 2002/0177557 A1 | 11/2002 | Shi | |
| 2002/0195419 A1 | 12/2002 | Pavelchek | |
| 2003/0186494 A1 | 10/2003 | Rantala et al. | |
| 2003/0219973 A1 | 11/2003 | Townsend, III et al. | |
| 2004/0002617 A1 | 1/2004 | Rantala et al. | |
| 2004/0012089 A1 | 1/2004 | Rantala et al. | |
| 2004/0023497 A1 | 2/2004 | Pan et al. | |
| 2004/0072436 A1 | 4/2004 | RamachandraRao et al. | |
| 2004/0077175 A1 | 4/2004 | Hsieh et al. | |
| 2004/0084680 A1 | 5/2004 | Ruelke et al. | |
| 2004/0121621 A1 | 6/2004 | Ruelke et al. | |
| 2004/0137241 A1 | 7/2004 | Lin et al. | |
| 2004/0185674 A1 | 9/2004 | M'Saad et al. | |
| 2004/0192804 A1 | 9/2004 | Kura et al. | |
| 2004/0214430 A1 | 10/2004 | Ruelke et al. | |
| 2004/0222412 A1 | 11/2004 | Bai et al. | |
| 2004/0224520 A1 | 11/2004 | Yun et al. | |
| 2004/0266201 A1 | 12/2004 | Wille et al. | |
| 2005/0006346 A1 | 1/2005 | Annapragada et al. | |
| 2005/0017365 A1 | 1/2005 | RamachandraRao et al. | |
| 2005/0040532 A1 | 2/2005 | Kumar et al. | |
| 2005/0064726 A1 | 3/2005 | Reid et al. | |
| 2005/0093158 A1 | 5/2005 | Liu et al. | |
| 2005/0095839 A1 | 5/2005 | Chang et al. | |
| 2005/0167839 A1 | 8/2005 | Wetzel et al. | |
| 2005/0233572 A1 | 10/2005 | Su et al. | |
| 2005/0250348 A1* | 11/2005 | Xia et al. | 438/788 |
| 2005/0260845 A1 | 11/2005 | Ali | |
| 2005/0272237 A1 | 12/2005 | Hautala et al. | |
| 2006/0024968 A1 | 2/2006 | Hudson et al. | |
| 2006/0057801 A1 | 3/2006 | Rantala et al. | |
| 2006/0063386 A1 | 3/2006 | Tsai et al. | |
| 2006/0105181 A1* | 5/2006 | Lin et al. | 428/447 |
| 2006/0205203 A1 | 9/2006 | Lu et al. | |
| 2006/0267201 A1 | 11/2006 | Huebler et al. | |
| 2007/0001306 A1 | 1/2007 | Su et al. | |
| 2007/0085113 A1 | 4/2007 | Wu et al. | |
| 2007/0097514 A1 | 5/2007 | Matsuzawa et al. | |
| 2008/0076059 A1* | 3/2008 | Abdallah et al. | 430/270.1 |
| 2009/0174067 A1 | 7/2009 | Lin | |

FOREIGN PATENT DOCUMENTS

| | | |
|---|---|---|
| JP | 2004320037 | 11/2004 |
| WO | WO9810778 | 3/1998 |
| WO | WO0020440 | 4/2000 |
| WO | WO03065987 A2 | 8/2003 |
| WO | WO2004096838 A1 | 11/2004 |

OTHER PUBLICATIONS

Office Action dated Oct. 15, 2010 received in a related U.S. Patent Application, namely U.S. Appl. No. 12/772,451.

Office Action dated Jun. 25, 2010 received in a related U.S. Patent Application, namely U.S. Appl. No. 11/858,636.

European Patent Application Publication No. EP1077218 A2 dated Feb. 21, 2001, English-language abstract only.

Belvisi, L., et al., "Conformational Preferences of Peptides Containing Reverse-Turn Mimetic Bicyclic Lactams: Inverse γ-Turns versus Type-II' β-Turns—Insights into β-Hairpin Stability", European Journal of Medicinal Chemistry, Jan. 1, 1999, pp. 389-400, No. 2, Editions Scientifique Esevier, Paris, France.

Gennari, C., et al., "Solid-Phase Synthesis of Peptides Containing Reverse-Turn Mimetic Bicyclic Lactams", European Journal of Medicinal Chemistry, Jan. 1, 1999, pp. 379-388, No. 2, Editions Scientifique Esevier, Paris, France.

Obrecht, D., et al., "Novel Peptide Mimetic Building Blocks and Strategies for Efficient Lead Finding", Advances in Medicinal Chemistry, Apr. 1, 1999, pp. 1-68, JAI Press, U.S.

Hansseian, S., et al., "Design and Synthesis of Conformationally Constrained Amino Acids as Versatile Scaffolds and Peptide Mimetics", Tetrahedron, Sep. 22, 1997, pp. 12789-12584, vol. 53, No. 38, Elsevier Science Publishers, Amsterdam, Netherlands.

Notice of Allowance dated Aug. 24, 2011 received in a related U.S. Patent Application, namely U.S. Appl. No. 11/858,624.

Office Action dated Sep. 30, 2011 received in a related U.S. Patent Application, namely U.S. Appl. No. 11/858,636.

* cited by examiner

INTERCONNECT STRUCTURES WITH PATTERNABLE LOW-K DIELECTRICS AND METHOD OF FABRICATING SAME

CROSS REFERENCE TO RELATED APPLICATION

This application is a divisional of U.S. patent application Ser. No. 11/858,624, filed Sep. 20, 2007 the entire content and disclosure of which is incorporated herein by reference.

FIELD OF THE INVENTION

The present invention relates to an interconnect structure and a method of fabricating interconnect structures. Specifically, the present invention relates to interconnect structures that are part of integrated circuits and microelectronic devices with patternable dielectrics and a method of fabricating the same. More specifically, the present invention relates to single-damascene or dual-damascene low-k interconnect structures with a positive-tone or a negative-tone patternable dielectric and methods of fabricating the same.

BACKGROUND OF THE INVENTION

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to reduce the dielectric constant, k, of the interlayer dielectric (ILD) materials used to electrically insulate the metal lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an interactive additive process, called dual-damascene, which includes several processing steps. For example, a typical dual-damascene process includes film deposition, patterning by lithography and reactive ion etching, liner deposition, Cu metal fill by electrochemical plating, and chemical-mechanical polishing of excessive Cu metal; these steps are described in greater detail in the following paragraphs.

When fabricating integrated circuit wiring within a multi-layered scheme, an insulating or dielectric material, e.g., silicon oxide or a low-k insulator will normally be patterned with several thousand openings to create conductive line openings and/or via openings using photo patterning and plasma etching techniques, e.g., photolithography with a photoresist subsequently followed by etching by plasma processes. The via openings are typically filled with a conductive metal material, e.g., aluminum, copper, etc., to interconnect the active and/or passive elements of the integrated circuits. The semiconductor device is then polished to level its surface.

A continuous cap layer is then normally deposited over the planarized surface featuring the dielectric material and conductive metal material. Next, a dielectric material is deposited over the continuous cap layer, via and conductive line openings are created within the dielectric layer as before, another conductive metal material is deposited within the openings and another continuous cap layer is deposited thereon. The process is repeated to fabricate a multi-layer interconnect wiring system. The multi-layer interconnect system built thereby is referred to in the art as a dual-damascene integration scheme.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k dielectrics exhibit fundamentally weaker electrical and mechanical properties as compared to silicon oxide. Moreover, the low-k dielectric alternatives are typically susceptible to damage during the various interconnect processing steps. The damage observed in the low-k dielectric materials is manifested by an increase in the dielectric constant and increased moisture uptake, which may result in reduced performance and device reliability.

One way to overcome the integration challenges of low-k materials is to protect these low-k dielectric materials by adding at least one sacrificial hardmask layer onto a surface of the low-k dielectric material. While the hardmask layer serves to protect the low-k material, the presence of the sacrificial hardmask layer adds enormous process complexity as more film deposition, pattern transfer etch, and removal of hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure.

For example, a via-first LTO integration for forming a dual-damascene interconnect includes the steps of: depositing a dielectric material on a substrate including a patterned conductor; forming at least one via in said dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of films are not needed in the final interconnect structure.

Although immensely popular in semiconductor manufacturing, the prior art dual-damascene integration scheme described above suffers from several drawbacks including:

I. First, it constitutes a significant portion of manufacturing cost of advanced semiconductor chips as many layers, up to twelve layers for the state-of-the-art chips, are required to connect the minuscule transistors within a chip and to the printed circuit board.

II. Second, it is a main yield detractor as the many layers of films required to form the interconnects generate chances for defect introduction and, thus, degrade manufacturing yields.

III. Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating.

IV. Fourth, the performance gain by introduction of new lower-k materials is often offset by the needs for higher-k non-sacrificial materials, such as a cap layer, a hardmask layer, or a thicker copper barrier layer.

V. Fifth, the prior art complex dual-damascene process lengthens manufacturing turn-around time and R&D development cycle.

VI. Sixth, the plasma etching process is an expensive and often unreliable process and requires significant up-front capital investment.

In view of the above, there is a need to simplify the formation of interconnects (single-damascene and dual-damascene) including low-k dielectrics for cost-saving and manufacturing efficiency.

SUMMARY OF THE INVENTION

The problems described above in prior art processes of fabricating interconnect (single-damascene and dual-damascene) structures are solved by using a dramatically simplified integration method of this invention. The present invention thus relates to a method of forming interconnect structures that are part of integrated circuits and microelectronic devices with patternable dielectrics.

This invention circumvents the prior art drawbacks of current integration by combining the functions of a photoresist and a dielectric material into one material. This one material, called a photo-patternable low-k dielectric (or patternable low-k material for short), acts as a photoresist during the lithographic patterning process, and as such, no separate photoresist is required. After lithographic patterning, the patternable low-k dielectric is subsequently converted into a low-k material during a post patterning cure. In this way, the inventive method avoids plasma etching and the complex sacrificial film stack and processes required for conventional patterning.

Specifically, this invention relates to a simplified method of fabricating single-damascene and dual-damascene low-k interconnect structures with at least one patternable dielectric. In general terms and in one aspect of the present invention, a method is provided that comprises:

providing at least one patternable low-k material on top of a substrate;

forming at least one interconnect pattern within said at least one patternable low-k material, said at least one interconnect pattern is formed without utilizing a separate photoresist material; and curing said at least one patternable low-k material into a dielectric material having a dielectric constant of not more than 4.3.

In some embodiments of this method of the present invention, an antireflective coating is formed on the substrate prior to forming the patternable low-k material. In another embodiment of the present invention, a material stack comprising a dielectric cap and an antireflective coating is formed on top of the substrate prior to forming the patternable low-k material. When such materials are present, the present invention also contemplates a step of forming contact holes through the antireflective coating or material stack after forming the interconnect patterns.

In yet a further embodiment of the present invention, a conductive material such as Al, Cu, or a Cu alloy is formed into the interconnect patterns. A planarization process such as chemical mechanical polishing may follow the step of filling the interconnect patterns.

In an even further embodiment of the present invention, a dielectric cap is formed atop the cured low-k material after filling the interconnect patterns with a conductive material.

In any of the embodiments mentioned above, the interconnect patterns may comprise via openings, line openings, a combination of via openings located beneath line openings or a combination of line openings located beneath via openings. In one embodiment, it is preferred to have via openings located beneath line openings. It is noted that in the present invention each individual pair of line/via openings or via/line openings is interconnected.

The present invention contemplates the use of positive-tone patternable low-k materials, negative-tone patternable low-k materials or any combination thereof.

In another aspect of the present invention, the present invention provides a simplified method of fabricating dual-damascene low-k interconnect structures with at least one negative-tone patternable low-k dielectric and/or at least one positive-tone patternable low-k dielectric. This aspect of the present invention includes the steps of:

providing a first patternable low-k material on top of a substrate;

forming first interconnect patterns within the first patternable low-k material without utilizing a separate photoresist material;

providing a second patternable low-k material on top of the first patternable low-k material including said first interconnect patterns;

forming second interconnect patterns within said second patternable low-k material without utilizing a separate photoresist material; and curing at least said second patternable low-k material into a dielectric material having a dielectric constant of not more than 4.3.

In some embodiments of this method of the present invention, an antireflective coating is formed on the substrate prior to forming the first patternable low-k material. In another embodiment of the present invention, a material stack comprising a dielectric cap and an antireflective coating is formed on top of the substrate prior to forming the first patternable low-k material. When such materials are present, the present invention also contemplates a step of forming contact holes through the antireflective coating or material stack after forming the second interconnect patterns within the second patternable low-k material.

In yet other embodiments of the present invention, a curing step is performed after providing the first interconnect patterns to the first patternable low-k material.

In yet a further embodiment of the present invention, a conductive material such as Al, Cu, or a Cu alloy is formed into the first and second interconnect patterns. A planarization process such as chemical mechanical polishing may follow the step of filling the first and second interconnect patterns.

In an even further embodiment of the present invention, a dielectric cap is formed atop the cured second patternable low-k material after filling the first and second interconnect patterns with a conductive material.

In any of the embodiments mentioned above, the first interconnect patterns may comprise via openings, while the second interconnect patterns may comprise line openings. This embodiment is a preferred over an embodiment in which the first interconnect patterns comprise line openings and the second interconnect patterns comprise via openings.

This invention also relates to a simplified method of fabricating single-damascene low-k interconnect structures with negative-tone or positive-tone patternable low-k dielectrics. This aspect of the present invention comprises the steps of:
  providing a patternable low-k material on top of a substrate;
  forming interconnect patterns within the patternable low-k material without utilizing a separate photoresist material; and
  curing the patternable low-k material into a dielectric material having a dielectric constant of not more than 4.3.

In some embodiments of this method of the present invention, an antireflective coating is formed on the substrate prior to forming the patternable low-k material. In another embodiment of the present invention, a material stack comprising a dielectric cap and an antireflective coating is formed on top of the substrate prior to forming the patternable low-k material. When such materials are present, the present invention also contemplates a step of forming contact holes through the antireflective coating or material stack after forming the interconnect patterns within the patternable low-k material.

In yet a further embodiment of the present invention, a conductive material such as Al, Cu, or a Cu alloy is formed into the interconnect patterns. A planarization process such as chemical mechanical polishing may follow the step of filling the interconnect patterns.

In an even further embodiment of the present invention, a dielectric cap is formed atop the cured patternable low-k material after filling the interconnect patterns with a conductive material.

In any of the embodiments mentioned above, the interconnect patterns may comprise via openings or line openings.

This patternable low-k method of the present invention dramatically reduces the complexity in the fabrication of current interconnect structures. The photoresist used in the prior art integration is no longer needed. In addition the present invention also does not utilize a plasma etching step for patterning as also required in the prior art interconnect processing schemes. It is further noted that the inventive method reduces the number of layers required to fabricate the interconnect structure and, as such, the present invention reduces the time and cost of fabricating interconnect structures as compared to prior art processes.

In addition to the methods described above, the present invention also relates to interconnect structures which include the patternable low-k dielectric material in a cured state; in the cured state the patternable low-k material serves as the interconnect dielectric. In general terms, the present invention provides an interconnect structure comprising at least one patterned and cured low-k dielectric material located on a surface of a substrate, said at least one patterned and cured low-k film having conductively filled regions embedded therein and including Si atoms bonded to cyclic rings via oxygen atoms.

In one embodiment, a dual-damascene interconnect structure including first and second cured and patterned low-k materials each having the above mentioned Si bonding environment present is provided. In yet another embodiment of the present invention, a single-damascene interconnect structure is provided.

In yet another embodiment of the present invention, an antireflective coating that is patterned is located between the substrate and the cured and patterned low-k film. In a further embodiment of the present invention a dielectric cap layer is located on top of the substrate. In still another embodiment of the present invention, another dielectric cap can be present atop the patterned low-k film.

In yet another embodiment of the present invention, the conductively filled regions comprise Al, Cu or a Cu alloy. In an even further embodiment of the present invention, the conductively filled regions comprise a single via, a single line, a combined via/line or a combined line/via.

DETAILED DESCRIPTION OF THE INVENTION

The present invention, which provides single-damascene or dual-damascene low-k interconnect structures with a positive-tone or a negative-tone patternable dielectric and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known materials, structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, this invention circumvents the prior art drawbacks of current integration by combining the functions of a photoresist and a dielectric material into one material. This one material, called a patternable low-k dielectric herein, acts as a photoresist during the lithographic patterning process and, as such a separate photoresist is not required or used in the present invention. After lithographic patterning, the patternable low-k dielectric is subsequently converted into a low-k material during a post patterning cure. In this way, the inventive method avoids plasma etching and the complex sacrificial film stack and processes required for patterning. Specifically, this invention relates to a simplified method of fabricating single-damascene and dual-damascene low-k interconnect structures with at least one patternable dielectric.

In general terms, a method is provided that comprises depositing at least one patternable low-k material on top of a substrate; forming at least one interconnect pattern within said at least one patternable low-k material, said at least one interconnect pattern is formed without utilizing a separate photoresist material; and curing the at least one patternable low-k material into a dielectric material having a dielectric constant of not more than 4.3 (i.e., 4.3 or less). The inventive method can be used to form dual-damascene interconnect structures as well as single-damascene interconnect structures.

The present invention will now be described in reference to FIGS. 1A-1F which illustrate an embodiment of the present invention in which a dual-damascene structure is provided using patternable dielectrics as on-chip electrical insulators on a semiconductor chip.

Figure 1A:
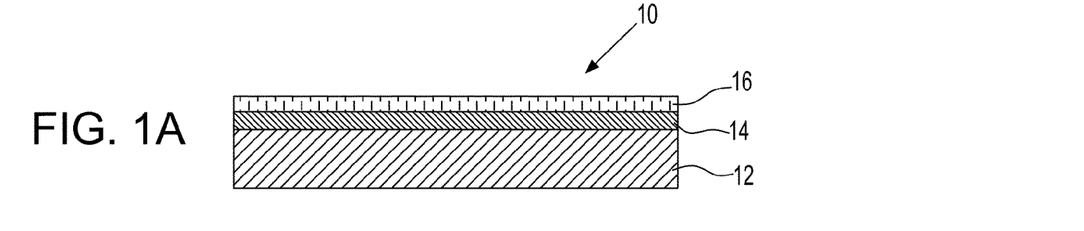
FIGS. 1A-1F are pictorial representations (through cross sectional views) depicting the basic processing steps employed for fabricating a dual-damascene interconnect structure using patternable dielectrics (dual-tone) as on-chip electrical insulators on a semiconductor chip.

FIG. 1A illustrates an initial structure 10 that is utilized in this embodiment of the present invention. The initial structure 10 includes a substrate 12, an optional dielectric cap 14 located on a surface of substrate 12, and optional antireflective coating 14 located on a surface of the optional dielectric cap 12.

The substrate 12 may comprise a semiconducting material, an insulating material, a conductive material or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate 12 is an insulating material, the insulating material can be an organic insulator, an inorganic insulator or a combination thereof including multilayers. The substrate 12 may also include a patternable low-k dielectric material of this invention as well. When the substrate 12 is a conducting material, the substrate may include, for example, polySi, an elemental metal, alloys of elemental metals, a metal silicide, a metal nitride or combinations thereof including multilayers. When the substrate 12 comprises a semiconducting material, one or more semiconductor devices such as, for example, complementary metal oxide semiconductor (CMOS) devices can be fabricated thereon.

The optional dielectric cap 14 is formed directly on the surface of substrate 12 utilizing a conventional deposition process such as, for example, chemical vapor deposition (CVD), plasma enhanced chemical vapor deposition (PECVD), atomic layer deposition (ALD), chemical solution deposition, or evaporation. The dielectric cap 14 comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer and a discontinuous layer. It can also be a select cap, such as CoWP. The thickness of the dielectric cap 14 may vary depending on the technique used to form the same as well as the material make-up of the layer. Typically, the dielectric cap 14 has a thickness from about 5 to about 55 nm, with a thickness from about 20 to about 45 nm being more typical.

Next, an optional antireflective coating (ARC) 16 is formed on a surface of the optional dielectric cap 14 if present, or directly on a surface of the substrate 12 when the dielectric cap 14 is not present.

The ARC 16 may be designed to control reflection of light that is transmitted through the patternable low-k film (to be subsequently formed), reflected off the substrate and back into the patternable low-k film, where it can interfere with incoming light and cause the low-k film to be unevenly exposed. The optical properties and thickness of ARC 16 is optimized to obtain optimal resolution and profile control of the patternable low-k material during the subsequent patterning steps, which is well known to those ordinarily skilled in the art. The thickness of the ARC 16 may vary depending on the technique used to form the same as well as the material make-up of the layer. Typically, the ARC 16 has a thickness from about 5 to about 200 nm, with a thickness from about 20 to about 140 nm being more typical. The antireflective coating 16 may be either organic or inorganic.

Antireflective coatings are well known to those skilled in the art and include homopolymers or copolymers of polyesters, polyimides, polyacrylates, polymethacrylates, polysulfones, amorphous carbon, and the like and may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed in the present invention and may be deposited, for example, by plasma-enhanced chemical vapor deposition, spin-on techniques, dipping, etc. After applying the ARC, particularly those from a liquid phase, a post deposition baking step is usually required to remove unwanted components, such as solvent, and to effect crosslinking. The post deposition baking step of the ARC 16 is typically, but not necessarily always performed at a temperature from about 80° to about 300° C., with a baking temperature from about 120° to about 200° C. being even more typical.

Figure 1B:
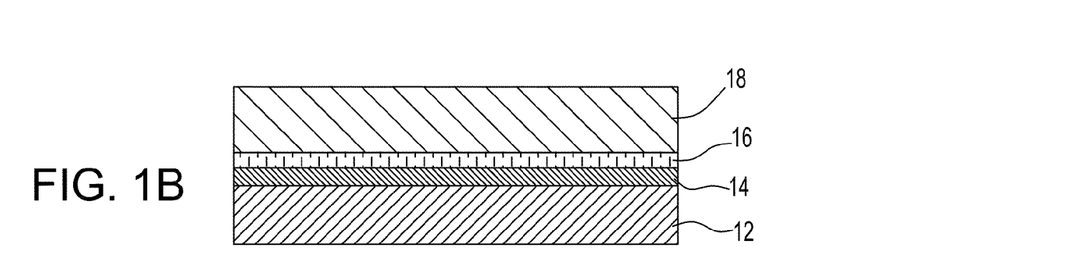

Next, and as illustrated in FIG. 1B, a first patternable low-k material 18, which combines the function of a photoresist and low-k material into one single material is provided. In the embodiment illustrated, the first patternable low-k material 18 is provided on the surface of the ARC 16. In other embodiments, the first patternable low-k material 18 can be provided directly on the dielectric cap layer 14 (when no ARC 16 is present) or directly on the surface of substrate 12 (when no ARC 16 or dielectric cap 14 are present).

The first patternable low-k material 18 is provided (i.e., formed) utilizing a conventional deposition process including, for example, spin-on-coating, dip coating, brush coating. After applying the first patternable low-k material 18, a post deposition baking step is typically, but not necessarily always, required to remove unwanted components, such as solvent. When performed, the baking step is conducted at a temperature from about 60° to about 200° C., with a baking temperature from about 80° to about 140° C. being even more preferred. The duration of the baking step varies and is not critical to the practice of the present invention.

The thickness of the first patternable low-k material 18 may vary depending on the technique used to form the same as well as the material make-up of the layer. Typically, the first patternable low-k material 18 has a thickness from about 10 to about 10000 nm, with a thickness from about 50 to about 2000 nm being more typical.

As stated above, the first patternable low-k material 18 functions as a photoresist and is converted into a low-k material during post patterning processing, by heat, UV light, electron beam, ion beam, microwave, plasma cure, thermal cure or combinations thereof. For instance, the first patternable low-k material 18 may comprise a functionalized polymer having one or more acid-sensitive imageable groups. These polymers or blends of polymers can be converted into low-k polymers after subsequent processing.

More specifically, the first patternable low-k material 18 comprises photo/acid-sensitive polymers of hydrocarbons, fluorinated hydrocarbons, siloxane, silane, carbosilane, oxycarbosilane, organosilicates, silsesquioxanes and the like. The polymers include, for example, silsesquioxane-type polymers including caged, linear, branched or combinations thereof. In one embodiment, the first patternable dielectric material 18 comprises a blend of these photo/acid-sensitive polymers. Examples of patternable dielectric materials useable with the present disclosure are disclosed in U.S. Pat. Nos. 7,041,748, 7,056,840, and 6,087,064, all of which are incorporated herein by reference in their entirety. The dielectric constant of the patternable low-k material 18 after cure is generally no more than 4.3. The dielectric constant may be greater than 1 and up to about 4.3, more preferably from about 1 to about 3.6, even more preferably from about 1 to about 3.0, further more preferably from about 1 to about 2.5, with from about 1 to about 2.0 being most preferred.

The first patternable low-k material 18 is formed from a composition that includes one of the above mentioned polymers or polymer blends, a photoacid generator, a base additive and a solvent typically used in a photoresists. The photoacid generators, base additives and solvents are well known to those skilled in the art and, as such, details regarding those components are not fully provided.

In a preferred embodiment, the first patternable low-k material 18 is a silsesquioxane polymer or copolymer including, for example, poly(methylsilsesquioxane) (PMS), poly(p-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), poly(p-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly (p-hydroxy-alpha-methylbenzylsilsesquioxane-co-p-alpha-methylbenzylsilsesquioxane) (PHMB/MBS).

In the compositions containing a blended polymer component, the silsesquioxane polymer in the blend may be selected from the silsesquioxane polymers described above or may be selected from other silsesquioxane polymers such as, for example, poly(methyl-silsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyp-hydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydrooxybenzylsilsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide)dimethylsilyloxy]silsesquioxane, octakis[4-(hydroxyphenylethyl)dimethylsilyloxy] silsesquioxane, and octakis[{2-(1',1'-bis(trifluoromethyl)-1'-hydroxyethyl)norbornyl}dimethylsilyloxy]silsesquioxane.

If desired, a combination of different silsesquioxane polymers may be used in the blend with the non-silsesquioxane polymer.

For positive tone patternable low-k material, the silicon-containing polymer employed in the present invention may be a homopolymer or a copolymer. Suitable types of such silicon-containing polymers include homopolymers or copolymers containing at least one monomer selected from the group consisting of a siloxane, a silane, a silsesquioxane and a silyne. Highly preferred silicon-backbone polymers are selected from the group consisting of poly(hydroxyphenyl alkyl)silsesquioxanes and poly (hydroxyphenyl alkyl) siloxanes, wherein the alkyl is a $C_{1-30}$ moiety. These preferred silicon-containing polymers are preferably fully or partially protected with acid-sensitive protecting groups.

Where the silicon-containing polymeric additive contains a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsesquioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl) methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, 0-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the patternable low-k material resist composition will provide good lithography performance, i.e., high resolution and good process window. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to: benzyl ether and t-alkyl ethers such t-butyl ether. Of the aforesaid ethers, it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed in the present invention include, but are not limited to: phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to: trimethylsilylether, dimethylethylsilylether and dimethylpropylsilylether. Of these silylethers, it is preferred that trimethylsilylether be employed.

In a preferred embodiment for negative-tone patternable low-k materials of the present invention are two miscible, or compatible, silsesquioxanes. The first silsesquioxane polymer is a linear, branched, caged compound or combination thereof having the following structural formula:

wherein each occurrence of $R_1$ is one or more acidic functional groups for base solubility; each occurrence of $R_2$ is a carbon functionality for controlling polymer dissolution in an aqueous base; $R_1$ is not equal to $R_2$; m and n represent the number of repeating units; m is an integer; and n is zero or an integer greater than zero.

In the present invention, $R_1$ is not limited to any specific functional group, and is preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R_1$ include:

In the present invention, $R_2$ is not limited to any specific carbon functional group, and is preferably selected from among linear or branched alkyls, cylcoalkyls, aromatics, arenes, and acrylates.

The silsesquioxane polymers of the present invention have a weight averaged molecular weight of about 400 to about 500,000, and more preferable from about 1500 to about 10,000. The $R_1$ and $R_2$ proportions and structures are selected to provide a material suitable for photolithographic processes.

A second polymer component of the blend material includes but is not limited to a family of organosilicates known as silsesquioxanes, having the structural formula:

wherein $R_3$ is preferable selected from alkyls, cycloalkyls, aryl, or a combination thereof, and are commercially available from Dow Corning, Shin-Etsu, or JSR, for example. The silsesquioxane is preferably poly(methylsilsesquioxane), and n is an integer about 10 to about 1,000 or more (including copolymers). The silsesquioxane polymers possess silanol end groups, but may also include halosilanes, acetoxysilanes, silylamines, and alkoxysilanes. In a preferred embodiment of the present invention, a silsesquioxane polymer LKD-2056 (JSR Corporation) which contains silanol end groups is employed.

A third component of the present invention is a photosensitive acid generator (PAG). Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers in the blend formulation is 1 to 99% of the total polymer composition. In the preferred embodiment of the invention, the composition of the acid sensitive polymer is 20 to 80% of the total polymer composition, and even more preferred, 30 to 60%.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers.

The patternable low-k material of the present invention also includes a casting solvent to dissolve the other components. Examples of suitable casting solvent include and is not limited to ethoxyethylpropionate (EEP), a combination of EEP and γ-butyrolactone, propylene-glycol monomethyl-ether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkylammonium hydroxides, cetyltrimethylammonium hydroxide, and 1,8-diaminonaphthalene. The compositions of the present invention are not limited to any specific selection of base.

The term "acid-sensitive" is used throughout the application to denote imageable functional groups which undergo a chemical reaction in the presence of an acid generated by a photoacid generator under exposure to radiation. The acid-sensitive imageable functional groups employed in the present invention may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

In one preferred embodiment, a positive-tone patternable low-k material 18 is used for via patterning. Either a positive-tone or a negative-tone patternable low-k material 18 is used for line patterning.

The aforementioned patternable low-k materials act as a photoresist in the present invention during patterning; they can be positive-tone or negative-tone, and sensitive to G-line, I-line, DUV (248 nm, 193 nm, 157 nm, 126 nm, and EUV (13.4 μm), an electron beam, or an ion beam.

Figure 1C:
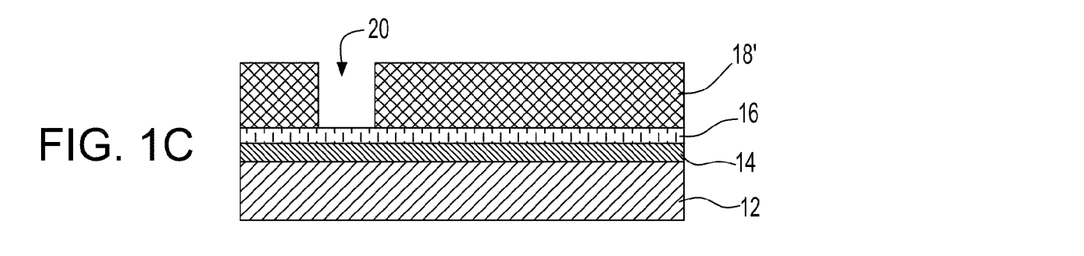

Next, and as shown in FIG. 1C, the first patternable low-k dielectric material 18 is pattern-wise exposed to form latent images of a desired circuitry. An optional post-exposure baking may be required to effect the photochemical reactions. When performed, the baking step is conducted at a temperature from about 60° to about 200° C., with a baking temperature from about 80° to about 140° C. being even more preferred. The duration of the baking step varies and is not critical to the practice of the present invention. After exposure and post-exposure baking, the latent images are developed into the low-k material.

The pattern-wise exposing process can be accomplished in a variety of ways, including, for example, through a mask with a lithography stepper or a scanner with an exposure light source of G-line, Mine (365 nm), DUV (248 nm, 193 nm, 157 nm, 126 nm), Extreme UV (13.4 nm), an electron beam, or an ion beam. The pattern-wise exposing process also includes direct writing without the use of a mask with, for example, light, electron beam, ion beam, and scanning probe lithography. Other patterning techniques that can be used in the present invention include contact printing techniques such as nanoimprint lithography, embroising, micro contact printing, replica molding, microtransfer molding, micromolding in capillaries and solvent-assisted micromolding, thermal assisted embroising, inject printing, and the like.

Specifically, FIG. 1C illustrates the structure that is formed after forming first interconnect patterns 20 within the patternable low-k film 18. The first interconnect patterns 20 may include at least one via opening (as shown and as preferred) or at least one line opening (not shown and less preferred that forming a via opening at this stage of the inventive method). As shown, the first interconnect patterns expose a surface of the ARC 16, if present. When the interconnect patterns 20 are via openings, a positive-tone patternable low-k material 18 is preferred.

After forming the first interconnect patterns, the low-k material 18 is typically, but not necessarily always, cured forming a cured low-k material 18' (See, FIG. 1C) in which the cured low-k material has Si atoms that are bonded to cyclic rings (aliphatic or aromatic) through oxygen atoms. The curing is optional when the first patternable low-k material is negative-tone, but it is required when the first patternable low-k material is a positive-tone material. This type of bonding is evident from $C^{13}$NMR or $^{29}$Si NMR.

Curing is performed in the present invention by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patternable low-k material into a low-k film with good electrical and mechanical properties.

In another embodiment, the irradiation cure step is performed by a combination of a thermal cure and an ultra-violet (UV) cure wherein the wavelength of the ultra-violet (UV) light is from about 50 to about 300 nm and the light source for the ultra-violet (UV) cure is a UV lamp, an excimer (exciplex) laser or a combination thereof.

In one embodiment, this post patterning cure is a combined UV/thermal cure. This combined UV/thermal cure is carried on a UV/thermal cure module under vacuum or inert atmosphere, such as $N_2$, He, Ar or by vacuum. Typically, the UV/thermal cure temperature is from about 100° C. to about 500° C., with a cure temperature from about 300° to about 450° C. being more typical. The duration of the UV/thermal cure is from about 0.5 min to about 30 min with a duration from about 1 to about 10 min being more typical. The UV cure module is designed to have a very low oxygen content to avoid degradation of the resultant dielectric materials.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from about 50 to about 300 nm. Additionally, the light of the ultra-violet (UV) cure may be enhanced and/or diffused with a lens or other optical diffusing device known to those skilled in the art.

Figure 1D:
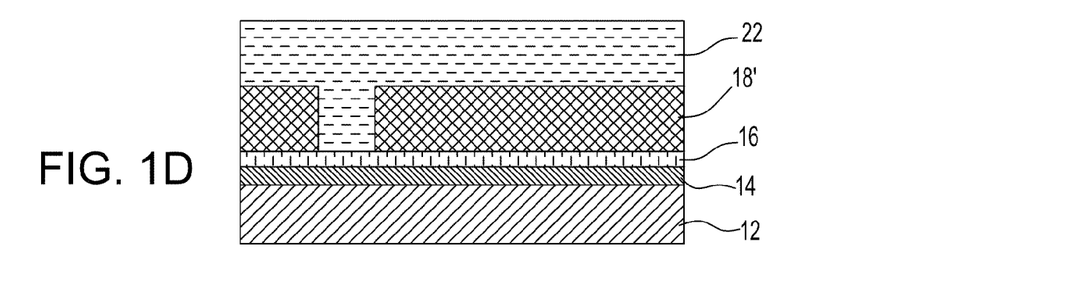

After patterning and optionally curing the first patternable low-k material 18, a second patternable low-k material 22 is then formed providing the structure shown in FIG. 1D. The second patternable low-k material 22 may comprise the same or different material as the first patternable low-k material 18. The deposition processes and thickness mentioned above for the first patternable low-k material 18 are each applicable here for the second patternable low-k material 22. Typically, and in the embodiment illustrated via-first integration scheme, the first patternable low-k material 18 is a positive-tone material, and the second low-k material 22 is either a negative-tone or a positive-tone material.

Figure 1E:
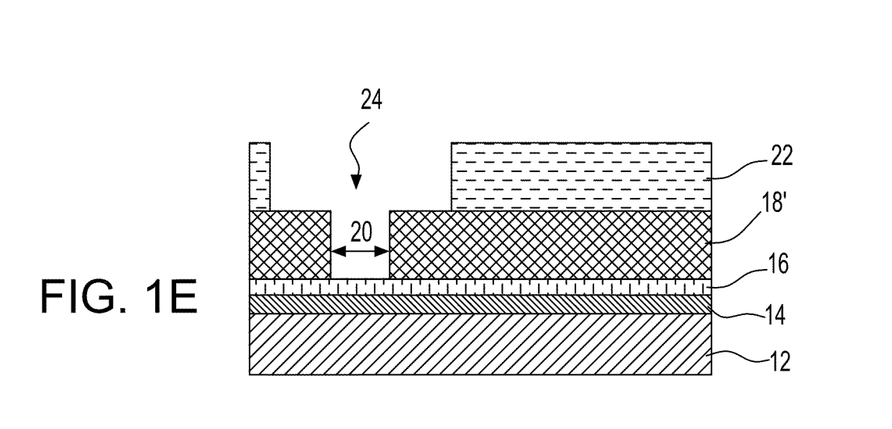

Next, and as shown in FIG. 1E, the second patternable low-k dielectric material 22 is patterned to include second interconnect patterns 24. The patterning of the second patternable low-dielectric material 22 is performed utilizing the same basic processing equipment and steps as those used for patterning the first patternable low-k dielectric material. In the illustrated embodiment of via-first integration scheme, the second interconnect pattern is typically a line. The second interconnect pattern may also be a via, when the first interconnect pattern is a line. When the second interconnect pattern is a via, a positive-tone is preferred for the second patternable low-k material 22.

Figure 1F:
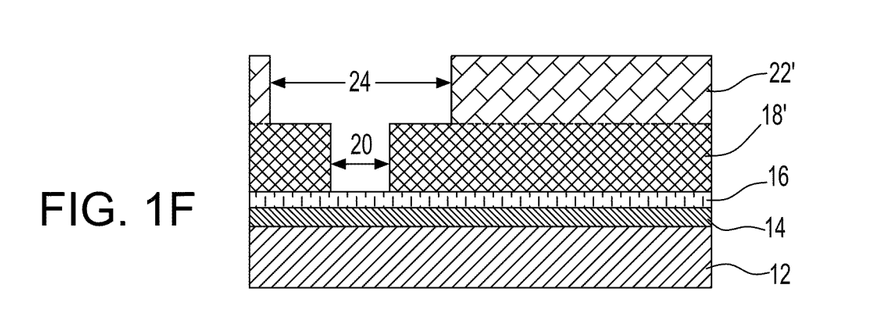

After patterning the second patternable low-k material 22, the structure is cured providing the structure shown in FIG. 1F. In FIG. 1F, reference numeral 22' denotes the cured second low-k material Like the first cured low-k material 18', the cured second low-k material 22' has a dielectric constant within the ranges mentioned above and it also is characterized as having Si atoms bonding to cyclic rings (aliphatic or aromatic) via oxygen atoms. If not previously cured, this curing step also cures the first patternable low-k material 18 into a cured low-k material 18' having the Si bonding environment mentioned above.

Figure 2:
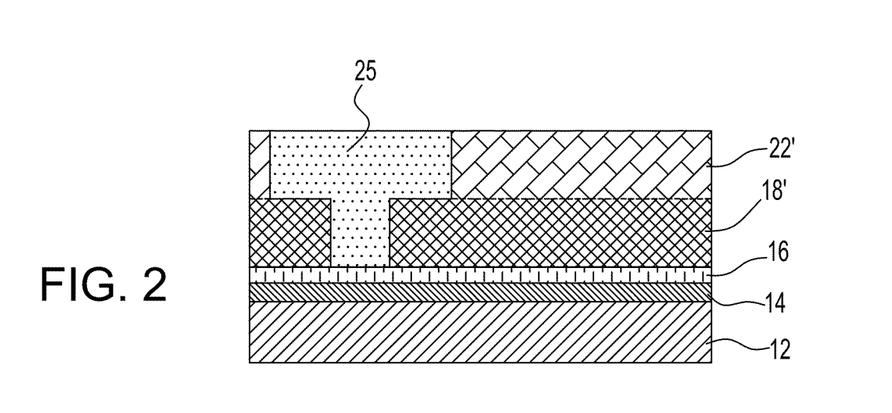
FIG. 2 shows the interconnect structure that is formed after further processing of the structure shown in FIG. 1F.

Further interconnect processing is then performed on the structure in FIG. 1F providing the structure shown in FIG. 2. In some embodiments, the substrate 12 illustrated in FIG. 2 may include a conductive feature embedded therein. When this embodiment is employed, layers 16 and 14 are first opened by etching and exposing a surface of the conductive feature in the substrate 12 using the patterned and cured patternable low-k interconnect structure as an etch mask. The conductive material is then filled into the opening contacting the conductive material in the substrate 12. This includes etching through the ARC 16 and dielectric cap 14 if present, utilizing an etching process such as, for example, reactive ion etching. Next, a diffusion barrier liner (not shown), which may comprise Ta, TaN, Ti, TiN, Ru, RuTaN, RuTa, W, WN or any other material that can serve as a barrier to prevent conductive material from diffusing there through, is typically formed into the first and second interconnect patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from about 4 to about 40 nm, with a thickness from about 7 to about 20 nm being more typical.

Following the formation of the diffusion barrier liner, the remaining region of the first and second interconnect patterns is filled with a conductive material 25 forming a conductive feature. The conductive material 25 used in forming the conductive feature includes, for example, polySi, a conductive metal, an alloy comprising at least one conductive metal, a conductive metal silicide or combinations thereof. Preferably, the first conductive material 25 that is used in forming the conductive feature is a conductive metal such as Cu, W or Al, with Cu or a Cu alloy (such as AlCu) being highly preferred in the present invention. The conductive material 25 is filled into the remaining first and second interconnect patterns utilizing a conventional deposition process including, but not limited to CVD, PECVD, sputtering, chemical solution deposition or plating.

After deposition, a conventional planarization process such as, for example, chemical mechanical polishing (CMP) can be used to provide a structure in which the diffusion barrier liner and the conductive material 25 each have an upper surface that is substantially coplanar with the upper surface of the cured second low-k material 22'.

After forming the at least one conductive material 25, another dielectric cap (not shown) is formed on the surface of the cured second low-k material 22' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP. The thickness of the dielectric cap may vary depending on the technique used to form the same as well as the material make-up of the layer. Typically, the dielectric cap has a thickness from about 5 to about 55 nm, with a thickness from about 20 to about 45 nm being more typical.

In addition to the dual-damascene embodiment mentioned above, the present invention also contemplates a single-damascene embodiment which will now be described in greater detail in reference to FIGS. 3A-3D.

Figure 3A:
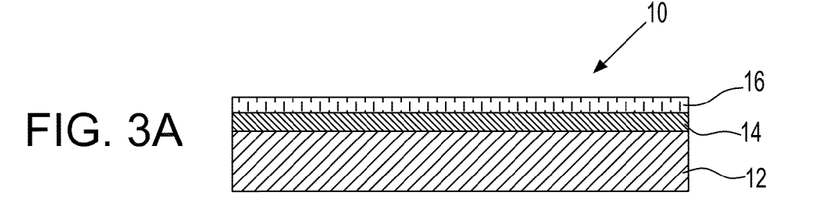
FIGS. 3A-3D are pictorial representations (through cross sectional views) depicting the basic processing steps employed for fabricating a single-damascene interconnect structure using a patternable dielectric as an on-chip electrical insulator on a semiconductor chip.

FIG. 3A shows an initial structure 10 that can be used in this embodiment of the present invention. The initial structure 10 shown in FIG. 3A is identical to the initial structure shown in FIG. 1A. Specifically, the initial structure shown in FIG. 3A also includes a substrate 12, an optional dielectric cap 14 located on a surface of the substrate 12, and an optional ARC 16 located on the surface of the dielectric cap 14. The materials, deposition methods, and thickness of each of substrate 12, optional dielectric cap 14 and optional ARC 16 are the same as that described above for the dual-damascene embodiment of the present invention.

Figure 3B:
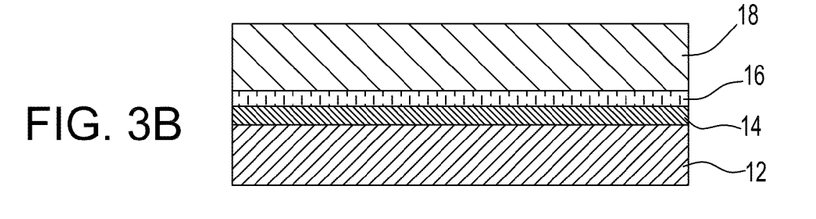

FIG. 3B shows the structure of FIG. 3A after forming a patternable low-k material 18 on the surface of the ARC 16. The patternable low-k material 18 may be a positive-tone material or a negative-tone material. The composition of the patternable low-k material 18 in this embodiment of the invention is the same as that mentioned above in the dual-damascene embodiment. Also, the patternable low-k material 18 is formed as described above and it has a thickness within the ranges mentioned above as well.

Figure 3C:
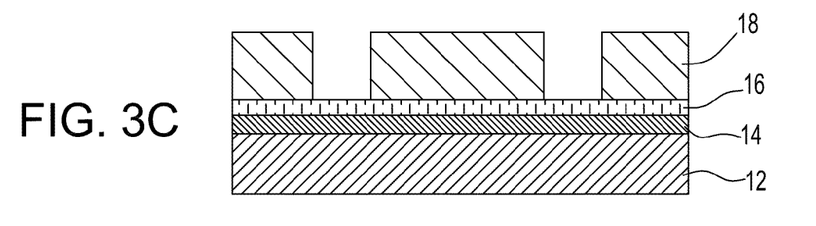

FIG. 3C illustrates the structure after forming interconnect patterns 20 within the patternable low-k film 18. The interconnect patterns 20 may include at least one via opening (as shown and as preferred) or at least one line opening. As shown, the first interconnect pattern exposes a surface of the ARC 16, if present. The formation of the interconnect patterns 20 into the patternable low-k material 18 includes the patterning equipment and process mentioned above in the dual-damascene embodiment.

Figure 3D:
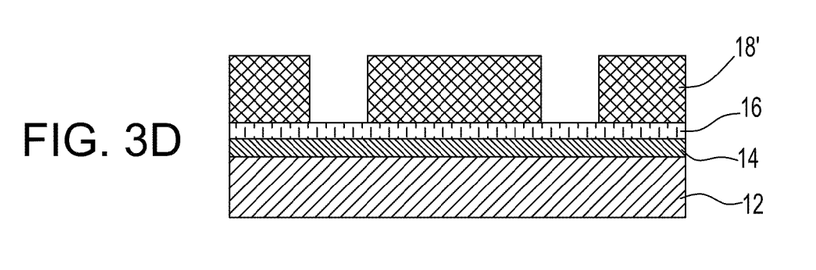

FIG. 3D illustrates the structure that is formed after curing the patternable low-k material 18 into cured low-k material 18'. The cured low-k material 18' has a dielectric constant within the ranges mentioned above and it also has Si atoms bonded to cyclic rings (aliphatic or aromatic) via oxygen atoms, as measured by NMR. In the uncured state, such bonding is not observed.

Figure 4:
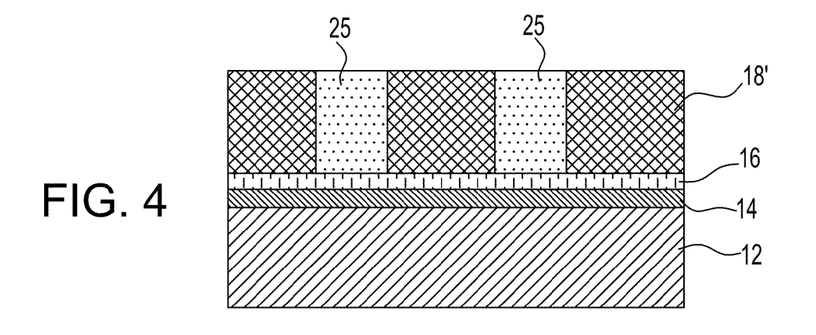
FIG. 4 shows the interconnect structure that is formed after further processing of the structure shown in FIG. 3D.

FIG. 4 illustrates the structure that is formed after further interconnect processing steps including at least filling the interconnect patterns with a conductive material 25 and planarizing the same; it is noted that in FIG. 4 an embedded conductive feature may also be within the substrate 12 (in such an embodiment layers 16 and 14 are etched opened prior to filling the conductive material 25 in the structure). The further processing steps of the present invention have been described in greater detail in regard to the dual damascene embodiment.

Figure 5:
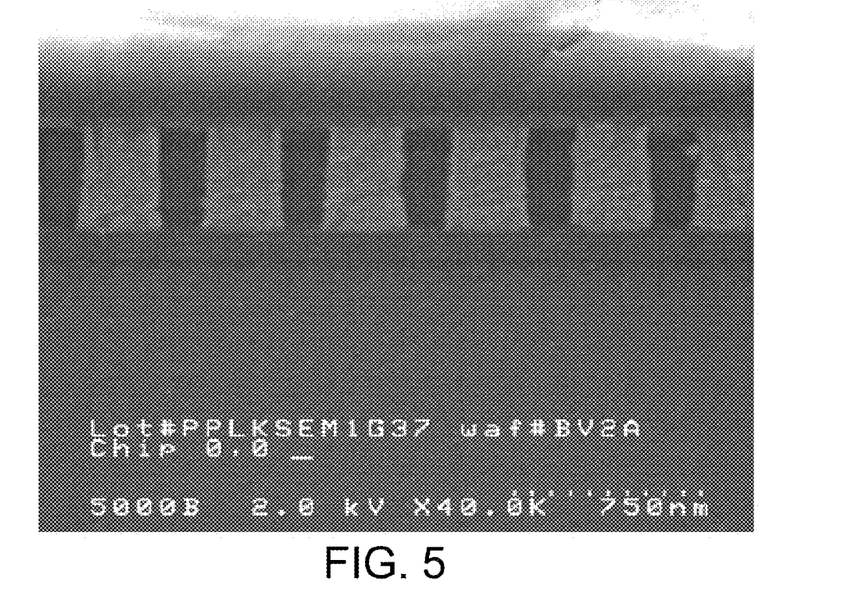
FIG. 5 shows a single damascene build of patterned and cured patternable low-k material embedded in conductively filled Cu in accordance with one embodiment of the present invention.
Figure 6:
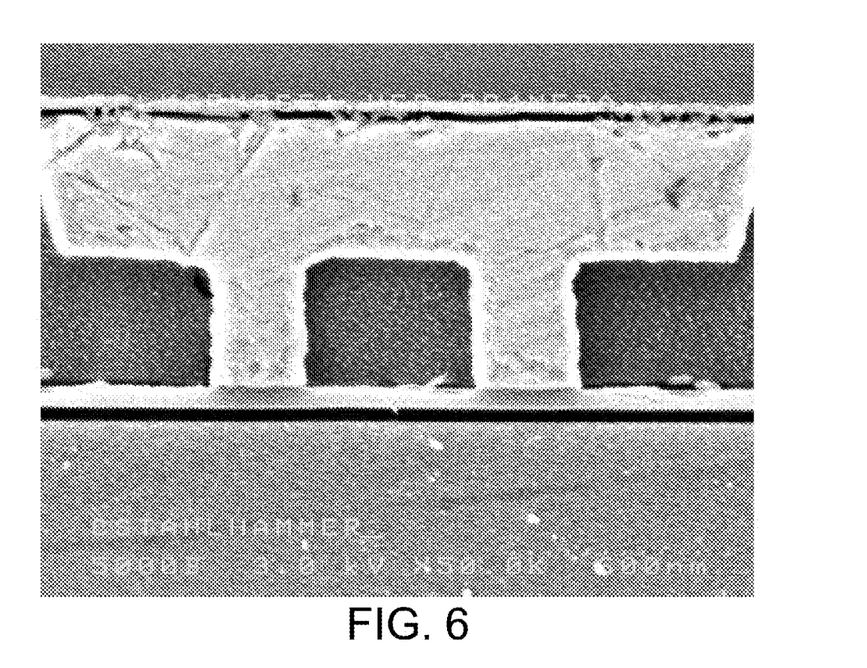
FIG. 6 shows a dual damascene build of patterned and cured patternable low-k material embedded in conductively filled Cu in accordance with another embodiment of the present invention.

FIG. 5 is an actual SEM of a single-damascene interconnect structure prepared as described above. FIG. 6 is an actual SEM of a dual-damascene interconnect as also prepared above.

The following non-limiting examples are provided to illustrate some embodiment of the present invention.

EXAMPLES

Example 1

Single-Damascene Integration of Negative-Tone Patternable Low-k Dielectric Having a Dielectric Constant of 2.7 as an On-Chip Electrical Insulator A. Material, Composition A patternable low-k composition was formulated with 60 g of a 20 wt % solution of 6:4 poly(p-hydroxy-alpha-methyl-benzylsilsesquioxane-co-p-alpha-methylbenzylsilsesquioxane) (pHMBS/MBS) in propylene glycol monomethyl ether acetate (PGMEA), 40 g of a 20 wt % solution of the silsesquioxane copolymer LKD-2021, 2 g of a 20 wt % solution of triphenylsulfonium nonaflate in PGMEA, and 2 g of a 0.5 wt % solution of an organic base such as trioctylamine in PGMEA. The resulting patternable low-k formulation was filtered through a 0.2 micron (μm) filter.

B. CVD ARC Process

A 800 Å silicon carbide (SiC) film was deposited on 350 Å NBLOK substrate a 200 mm wafer as an anti-reflective coating. The tool used was a 200 mm CVD tool (Centura) from Applied Materials Inc. The process conditions were as follows: precursor trimethyl silane (TMS) 160 sccm, He as carrier, 400 sccm, pressure, 8.7 T, RF power 460 W, temperature 400° C., and deposition time of 80 sec.

C. Litho Process

This patternable low-k composition was spin coated (2000 rpm for 30 seconds) onto an 8 inch silicon wafer deposited with the NBLOK cap layer and the SiC ARC layer to produce an approximately 0.6 μm film. The wafer and film were pre-exposure baked at about 110° C. for 60 seconds (s), patternwise exposed to 248 nm deep ultraviolet (DUV) light on an ASML (0.63 NA, ⅝ annular) DUV stepper, and then post exposure baked at 110° C. for 60 s. This was followed by two 30 second puddle development steps with 0.26 N TMAH developer to resolve 250 nm line and space features at a radiant energy dose of 26 mJ/cm².

D. UV Cure Process

The wafer with 250 nm line and space pattern was subjected to a UV-thermal cure in an 8 inch Applied Materials Producer broadband UV cure tool. The process conditions were 400° C. for 10 min under a $N_2$ atmosphere and a pressure of 8 Torr. This UV thermal cure led to approximately 13% line width shrinkage by did not result in any loss in pattern fidelity.

E. Liner Process

Liner-Seed:

Liner and Cu seed were deposited in a 200 mm Endura Encore Ta/TaN tool from Applied Materials. About 95 Å TaN, 190 Å Ta, and 600 Å Cu seed were deposited sequentially.

F. Cu Plating and Annealing

This wafer was electrochemically plated on Ebara tool to fill the trenches with about 750 nm Cu. The plating bath used was: 40/10/50 (Cu/$H_2SO_4$/Cl) with Shipley additives: 18/5/1.5 (A-3001/Next Suppressor/L-2001) (ml/L).

The as-plated wafer was annealed at 350° C. for 1 hr in a $N_2$ atmosphere in a copper anneal oven.

G. Cu CMP Process

The excessive Cu was removed by chemical-mechanical polishing with an Ebara Frex Polisher. The polishing was conducted in stages with a V3 high-abrasive slurry. The total polish time was 45 s.

H. NBLoK Cap

A 350 Å of NBLOK cap layer was deposited on top of the polished patternable low-K/Cu interconnect with a 200 mm CVD tool (Centura) from Applied Materials Inc. The process conditions were: precursor trimethyl silane (TMS) 80 sccm, He as carrier gas 200 sccm, $NH_3$ 160 sccm, pressure, 2.0 T, RF power 300 W, temperature 400° C., and deposition time 24.5 sec. An 18 sec $NH_3$ pre-clean was performed prior to the NBLOK cap deposition.

I. Analysis:

1. X-Section SEM

The post UV cure SEM of the patternable low-k dielectric structure was taken on a LEO low voltage SEM 2. Cu/Low-K X-Section The patternable low-k/Cu interconnect structure was cross-sectioned and examined in a Hitachi SEM. The cross-sectioned surface was polished, decorated with a diluted HF aqueous solution.

Example 2

Dual-Damascene Integration of Negative-Tone Patternable Low-k Dielectric Having a Dielectric Constant of 2.7 as an On-Chip Electrical Insulator A. Material, Composition A patternable low-k composition was formulated with 60 g of a 20 wt % solution of 6:4 poly(p-hydroxy-alpha-methylbenzylsilsesquioxane-co-p-alpha-methylbenzylsilsesquioxane) (pHMBS/MBS) in propylene glycol monomethyl ether acetate (PGMEA), 40 g of a 20 wt % solution of the silsesquioxane copolymer LKD-2021, 2 g of a 20 wt % solution of triphenylsulfonium nonaflate in PGMEA, and 2 g of a 0.5 wt % solution of an organic base such as trioctylamine in PGMEA. The resulting patternable low-k formulation was filtered through a 0.2 micron (μm) filter.

B. CVD ARC Process

A 800 Å silicon carbide (SiC) film was deposited on 350 Å NBLOK substrate a 200 mm wafer as a anti-reflective coating. The tool used was 200 mm CVD tool (Centura) from Applied Materials Inc. The process conditions are: precursor trimethyl silane (TMS) 160 sccm, He as carrier, 400 sccm, pressure, 8.7 T, RF power 460 W, temperature 400° C., and deposition time of 80 sec.

C. Via Litho Process

This patternable low-k composition (AN2-040-3) was spin coated (2000 rpm for 30 seconds) onto an 8 inch silicon wafer deposited with the NBLOK cap layer and the SiC ARC layer to produce an approximately 0.6 μm film. The wafer and film were pre-exposure baked at about 110° C. for 60 seconds (s), pattern-wise exposed to 248 nm deep ultraviolet (DUV) light on an ASML (0.63 NA, 0.75 sigma) DUV stepper, and then post exposure baked at 110° C. for 60 s. This was followed by two 30 second puddle development steps with 0.26 N TMAH developer to resolve 300 nm via features at a radiant energy dose of 16 mJ/cm².

D. UV Cure Process

The wafer with 300 nm via pattern was subjected to a UV-thermal cure in an 8 inch Applied Materials Producer broadband UV cure tool. The process conditions were 400° C. for 10 min under a $N_2$ atmosphere and a pressure of 8 Torr.

E. Trench Litho Process

This patternable low-k composition was spin coated (2000 rpm for 30 seconds) onto an 8 inch silicon wafer that had the via patterns. The wafer and film were pre-exposure baked at about 110° C. for 60 seconds (s), pattern-wise exposed to 248 nm deep ultraviolet (DUV) light on an ASML (0.63 NA, 0.75 sigma) DUV stepper, and then post exposure baked at 110° C. for 60 s. This was followed by two 60 second puddle development steps with 0.26 N TMAH developer to resolve 300 nm trench features over the via patterns at a radiant energy dose of 37 mJ/cm².

F. UV Cure Process

The wafer with 300 nm dual-damascene (via and trench pattern) structure was subjected to a UV-thermal cure in an 8 inch Applied Materials Producer broadband UV cure tool. The process conditions were 400° C. for 10 min under a $N_2$ atmosphere and a pressure of 8 Ton. The dual damascene pattern fidelity was maintained after the UV cure.

G. Liner Process

Liner-Seed with Sacrificial TaN Degas:

Liner and Cu seed were deposited in a 200 mm Endura Encore Ta/TaN tool from Applied Materials. About 95 Å TaN, 190 Å Ta, and 600 Å Cu seed were deposited sequentially.

H. Cu Plating and Annealing

This wafer was electrochemically plated on SEMITOOL tool to fill the trenches with about 1200 nm Cu. The plating bath used was: 40/10/50 (Cu/H2SO4/Cl) with Shipley additives: 18/5/1.5 (A-3001/Next Suppressor/L-2001) (ml/L).

The as-plated wafer was annealed at 350° C. for 1 hr in a $N_2$ atmosphere in a copper anneal oven.

I. Cu CMP Process

The excessive Cu was removed by chemical-mechanical polishing with an Ebara Frex Polisher. The polishing was conducted in stages with a V3 high-abrasive slurry. The total polish time was 210 sec.

J. NBLoK Cap

A 350 Å of continuous NBLOK cap layer was deposited on top of the polished patternable low-K/Cu interconnect with a 200 mm CVD tool (Centura) from Applied Materials Inc. The process conditions are: precursor trimethyl silane (TMS) 80 sccm, He as carrier gas 200 sccm, NH3 160 sccm, pressure, 2.0 T, RF power 300 W, temperature 400° C., and deposition time 24.5 sec. An 18 sec NH3 pre-clean was performed prior to the NBLOK cap deposition.

K. Analysis

1. X-Section SEM

The post UV cure SEM of the patternable low-k dielectric structure was taken on a LEO low voltage SEM 2. Cu/Low-K X-Section The patternable low-k/Cu interconnect structure was cross-sectioned and examined in a Hitachi SEM. The cross-sectioned surface was polished, decorated with a diluted HF aqueous solution.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a substrate;
   a patterned and cured antireflective coating located on an upper surface of the substrate;
   a lower patterned and cured low-k material layer located directly on a surface of the patterned and cured antireflective coating; and
   an abutting upper patterned and cured low-k material layer located on said lower patterned and cured low-k material layer, said lower and upper patterned and cured low-k material layers and said patterned and cured antireflective coating having conductively filled regions located therein and each of said cured and patterned low-k material layers has Si atoms bonded to cyclic rings via oxygen atoms.

2. The interconnect structure of claim 1 further comprising a patterned dielectric cap located between said substrate and said patterned and cured antireflective coating.

3. The interconnect structure of claim 1 wherein said lower and upper patterned and cured low-k dielectric material layers each comprise a cured functionalized polymer.

4. The interconnect structure of claim 3 wherein said cured functionalized polymer comprises a polymer of a hydrocarbon, a fluorinated hydrocarbon, a siloxane, a silane, a carbosilane, an oxycarbosilane, an organosilicate or a silsesquioxane.

5. An interconnect structure comprising:
   a substrate;
   a patterned and cured antireflective coating located atop a surface of the substrate;
   a lower patterned and cured low-k material layer located directly on a surface of the patterned and cured antireflective coating; and
   an abutting upper patterned and cured low-k material layer located on said lower patterned and cured low-k material layer, said lower and upper patterned and cured low-k material layers and said patterned and cured antireflective coating having conductively filled regions located therein.

6. The interconnect structure of claim 5 further comprising a patterned dielectric cap located between said substrate and said patterned and cured antireflective coating.

7. A method of fabricating an interconnect structure comprising:
   forming an antireflective coating atop a surface of a substrate;
   providing at least one patternable low-k material directly on an upper surface of the antireflective coating;
   forming at least one interconnect pattern within said at least one patternable low-k material, said at least one interconnect pattern is formed without utilizing a separate photoresist material;
   curing said at least one patternable low-k material into a dielectric material having a dielectric constant of not more than 4.3;
   forming an opening in said antireflective coating; and
   filing said interconnect pattern within said at least one patternable low-k material and said opening in said antireflective coating with a conductive material.

8. The method of claim 7 wherein said at least one patternable low-k material is a functionalized polymer having one or more irradiation/acid-sensitive imageable groups.

9. The method of claim 8 wherein said functionalized polymer comprises a polymer of a hydrocarbon, a fluorinated hydrocarbon, a siloxane, a silane, a carbosilane, an oxycarbosilane, an organosilicate or a silsesquioxane.

10. The method of claim 7 wherein said curing comprises a thermal cure, an electron beam cure, an UV cure, an ion beam cure, a plasma cure, a microwave cure or any combination thereof.

11. A method of fabricating a dual-damascene interconnect structure comprising:
   forming an antireflective coating atop a surface of a substrate;
   providing a first patternable low-k material directly on an upper surface of said antireflective coating;
   forming first interconnect patterns within the first patternable low-k material;
   providing a second patternable low-k material on top of the first patternable low-k material including said first interconnect patterns;
   forming second interconnect patterns within said second patternable low-k material;
   curing at least said second patternable low-k material into a dielectric material having a dielectric constant of not more than 4.3;
   forming an opening in said antireflective coating; and
   filing said first and second interconnect patterns and said opening with a conductive material.

12. The method of claim 11 wherein the first interconnect patterns are vias, and said second interconnect patterns are lines, wherein each line is interconnect to a via.

13. The method of claim 11 wherein said first and second patternable low-k materials are the same or different and comprise functionalized polymers having one or more irradiation/acid-sensitive imageable groups.

14. The method of claim 13 wherein said functionalized polymers comprise polymers of hydrocarbons, fluorinated hydrocarbons, siloxanes, silanes, carbosilanes, oxycarbosilanes, organosilicates or silsesquioxanes.

15. The method of claim 11 wherein said curing at least said second patternable low-k material comprises a thermal cure, an electron beam cure, an UV cure, an ion beam cure, a plasma cure, a microwave cure or any combination thereof.

16. The method of claim 11 wherein said first patternable low-k material is a cured negative-tone material and said second patternable low-k material is a positive or negative-tone material.

17. The method of claim 11 wherein said first patternable low-k material is a cured positive-tone material and said second patternable low-k material is a positive or negative-tone material.

* * * * *